United States Patent
Matsui et al.

(10) Patent No.: US 7,958,632 B2
(45) Date of Patent: Jun. 14, 2011

(54) FLEXIBLE PRINTED-CIRCUIT BOARDS BONDING METHOD AND PRINTED CIRCUIT BOARD

(75) Inventors: Jun Matsui, Kawasaki (JP); Koji Terada, Kawasaki (JP); Hiroyuki Nobuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 618 days.

(21) Appl. No.: 11/589,239

(22) Filed: Oct. 30, 2006

(65) Prior Publication Data

US 2007/0284135 A1  Dec. 13, 2007

(30) Foreign Application Priority Data

Jun. 12, 2006 (JP) .................................. 2006-162849

(51) Int. Cl.
*H01R 43/00* (2006.01)
*H05K 1/00* (2006.01)

(52) U.S. Cl. ................ 29/884; 29/832; 29/827; 29/840; 29/885; 29/886; 174/254

(58) Field of Classification Search .................. 29/840, 29/827, 830, 831, 832; 438/110, 111, 119, 438/123; 228/118, 157, 208, 3.1; 156/292, 156/305

See application file for complete search history.

(56) References Cited

U.S. PATENT DOCUMENTS

| 4,749,120 | A | * | 6/1988 | Hatada ....................... 228/123.1 |
| 4,818,728 | A | * | 4/1989 | Rai et al. ........................ 438/108 |
| 4,939,570 | A | * | 7/1990 | Bickford et al. ............... 257/722 |
| 5,317,438 | A | * | 5/1994 | Suzuki et al. .................. 349/192 |
| 5,526,563 | A | * | 6/1996 | Tamaki et al. ................... 29/830 |
| 5,543,585 | A | * | 8/1996 | Booth et al. ................... 174/261 |
| 5,799,392 | A | * | 9/1998 | Mishiro ........................... 29/830 |
| 6,234,776 | B1 | * | 5/2001 | Hayashi et al. ................ 418/133 |
| 6,328,427 | B1 | | 12/2001 | Watanabe et al. |
| 6,523,734 | B1 | * | 2/2003 | Kawai et al. .................. 156/73.1 |
| 6,570,098 | B2 | * | 5/2003 | Shimizu et al. ............... 174/255 |

FOREIGN PATENT DOCUMENTS

| JP | 6-275931 | | 9/1994 |
| JP | 2001-210943 | | 8/2001 |
| JP | 2003110240 | * | 4/2003 |
| JP | 2004-71997 | | 3/2004 |

* cited by examiner

*Primary Examiner* — Derris H Banks
*Assistant Examiner* — Tai Nguyen
(74) *Attorney, Agent, or Firm* — Staas & Halsey LLP (57) ABSTRACT

A first wiring board, which is a flexible printed-circuit board, is bonded to a second wiring board. A plurality of protruding member are formed on the surface of the second wiring board. An adhesive is deposited on the surface of the second wiring board such that there is a thinner layer of the adhesive on the protruding member than in other areas. Subsequently, the first wiring board is placed on the second wiring board so that a portion of the first wiring board to be used for the wire-bonding is positioned above at least one of the protruding members. The first wiring board gets bonded to the second wiring board due to the adhesive.

12 Claims, 7 Drawing Sheets

FLEXIBLE PRINTED-CIRCUIT BOARDS BONDING METHOD AND PRINTED CIRCUIT BOARD

BACKGROUND OF THE INVENTION

1. Field of the Invention

The present invention relates to a technology for bonding a flexible printed-circuit board to another printed circuit board.

2. Description of the Related Art

Recently, there is an increasing demand for reducing a size and improving a design flexibility of small electronic devices such as cellular telephones. To satisfy such a demand, flexible printed-circuit (FPC) boards have been widely used, in addition to the conventional electronic printed-circuit boards made of an electric insulating material such as glass epoxy that has been used for a long time. In the FPC board, a printed circuit board, which is a wiring pattern, is provided on the surface of or inside a flexible resin film.

When the electronic printed-circuit board and the FPC board are used together, electronic parts and/or wiring of the electronic printed-circuit board needs to be electrically connected to the FPC. If the circuit boards are designed for a relatively large electronic device, the device has enough space to fix the electronic printed-circuit board and the FPC board by using, i.e., fittings, and to connect the electronic printed-circuit board and the FPC board through, i.e., lead wires.

On the other hand, because a small electronic device cannot afford such space required for the fixation and the connection, the electronic printed-circuit board and the FPC board are often bonded using, i.e., an adhesive, and connected together by performing wire-bonding between the electronic parts of the electronic printed-circuit board and the FPC board. For example, Japanese Patent Application Laid-open No. H6-275931 discloses a technology for improving productivity that is otherwise to be lowered due to a contact failure and realizing a reliable wire-bonding, by adjusting the thickness of the material of the FPC board when the wire-bonding is performed between the electronic parts and the FPC board.

However, according to the disclosed technologies, problems caused by the adhesive are not considered. To perform the wire-bonding, an ultrasonic wire-bonding method is generally used, with which wires and an object is bonded by applying ultrasonic vibration to the wires made of, i.e., gold, and using friction generated between the wires and the object to be connected to the wires. The contact effect can be improved by applying heat to the object to be bonded to the wires.

Thus, when the wire-bonding is performed on the FPC board adhered to the electronic printed-circuit board, it is important to sufficiently apply ultrasound waves and heat to a contact portion. However, if the adhesive layer that bonds the electronic printed-circuit board and the FPC board is relatively thick, the layer absorbs the ultrasonic vibration and prevents the heat from properly flowing to the contact portion, which causes a connection failure. On the other hand, if the adhesive layer is relatively thin, the fixation strength is weakened, which increases the risk of the FPC board coming off from the electronic printed-circuit board.

SUMMARY OF THE INVENTION

It is an object of the present invention to at least partially solve the problems in the conventional technology.

According to an aspect of the present invention, a flexible printed-circuit boards bonding method for bonding a first wiring board that is formed of a flexible printed-circuit board and a second wiring board that is to be electrically connected to the first wiring board by wire-bonding, the flexible printed-circuit boards bonding method includes forming a plurality of protruding member on a surface of the second wiring board, depositing an adhesive on the surface of the second wiring board such that there is a thinner layer of the adhesive on the protruding member than in other areas, and placing, after the depositing, the first wiring board on the second wiring board so that a portion of the first wiring board to be used for the wire-bonding is positioned above at least one of the protruding members thereby bonding the first wiring board to the second wiring board with the adhesive.

According to another aspect of the present invention, a printed circuit board in which a first wiring board formed of a flexible printed-circuit board and a second wiring board to be electrically connected to the first wiring board by wire-bonding are bonded, the printed circuit board includes a protruding member arranged on a surface of the second wiring board, and an adhesive layer arranged on the protruding member and the surface of the second wiring board and that bonds the first wiring board and the second wiring board, wherein the adhesive layer is thinner on the protruding member than in other areas.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will be explained below in detail with reference to the attached drawings.

Figure 10:
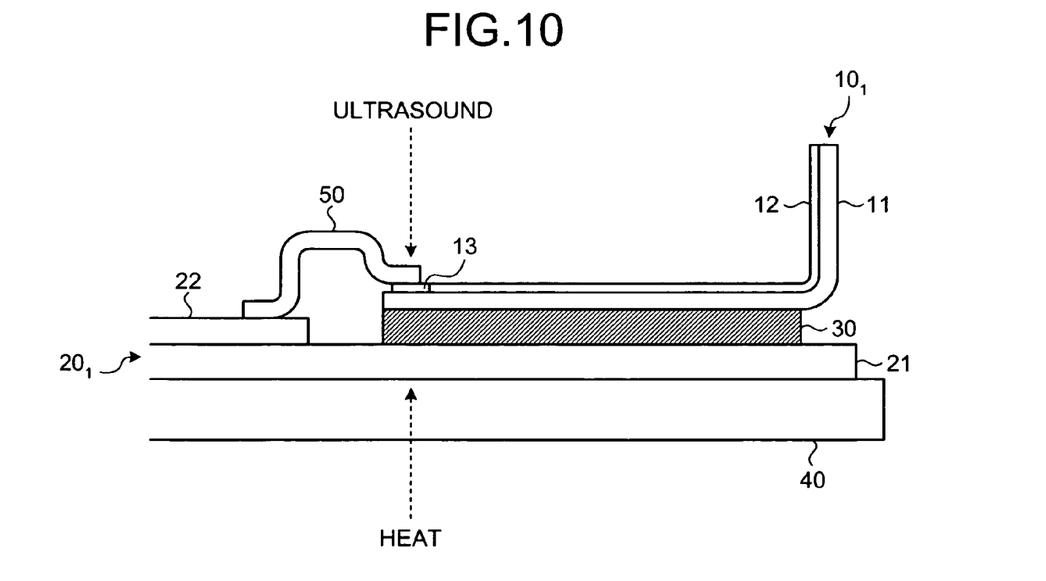
FIG. 10 is a side view for explaining an electrical connection between an electronic printed-circuit board and an FPC board by performing wire-bonding, through a conventional flexible printed-circuit boards bonding method.

An explanation of a conventional flexible printed-circuit boards bonding method will be given first. FIG. 10 is a side view for explaining an electrical connection between an electronic printed-circuit board $20_1$, and an FPC board $10_1$ by performing wire-bonding, which are bonded together through the conventional flexible printed-circuit boards bonding method.

As shown in FIG. 10, the FPC board $10_1$ and the electronic printed-circuit board $20_1$, are bonded together with an adhesive 30 and the resultant structure is arranged on a wire bonder stage 40. Thereafter, a wire 50 is brought into contact with a bonding pad 13 of the FPC board $10_1$ by the wire-bonding to establish an electrical connection between the FPC board $10_1$ and the electronic printed-circuit board $20_1$.

The FPC board $10_1$ is a printed circuit board in which wiring 12 is arranged on a flexible insulating film 11. The bonding pad 13, which serves as a terminal that is to be connected to the wire 50 by the wire-bonding, is provided on one end portion of the wiring 12. Various electronic parts can be mounted on the FPC board $10_1$, although they are not shown.

The electronic printed-circuit board $20_1$, is a printed circuit board in which wiring 22 is arranged on a board 21 made of an electrical insulating material such as glass epoxy. Various electronic parts can be mounted on the electronic printed-circuit board $20_1$, although they are not shown. The wire bonder stage 40 is a horizontally movable table, on which an object to be wire-bonded is placed.

The adhesive 30 bonds the FPC board $10_1$ and the electronic printed-circuit board $20_1$ together, forming a layer between the FPC board 101 and the electronic printed-circuit board $20_1$. The thickness of the layer can vary, depending on the amount of the adhesive 30 coated in the bonding process. In general, an adhesive has properties of high vibration absorption and low thermal conductivity. Therefore, the thickness of the layer of the adhesive 30 largely affects the reliability of the wire-bonding.

More specifically, when ultrasound is applied on top of the bonding pad 13 and heat is applied from beneath the bonding pad 13 through the board 21 and the adhesive 30 for performing the wire-bonding between the wire 50 and the bonding pad 13, if the layer of the adhesive 30 is relatively thick, the adhesive 30 absorbs the ultrasonic vibration and prevents the heat from sufficiently conducting, which results in contact failure. The contact failure does not immediately lead to a break in wiring, but still causes problems such that contact resistance increases and reliability gets lowered in the long term.

On the other hand, when the layer of the adhesive 30 is thin, because fixation strength reduces, there is a threat that the FPC board $10_1$ comes off from the electronic printed-circuit board $20_1$. With the conventional flexible printed-circuit boards bonding method, as described above, it is difficult to prevent the layer of the adhesive 30 from absorbing ultrasound and lowering the heating efficiency and to ensure the fixation strength at the same time.

Figure 1:
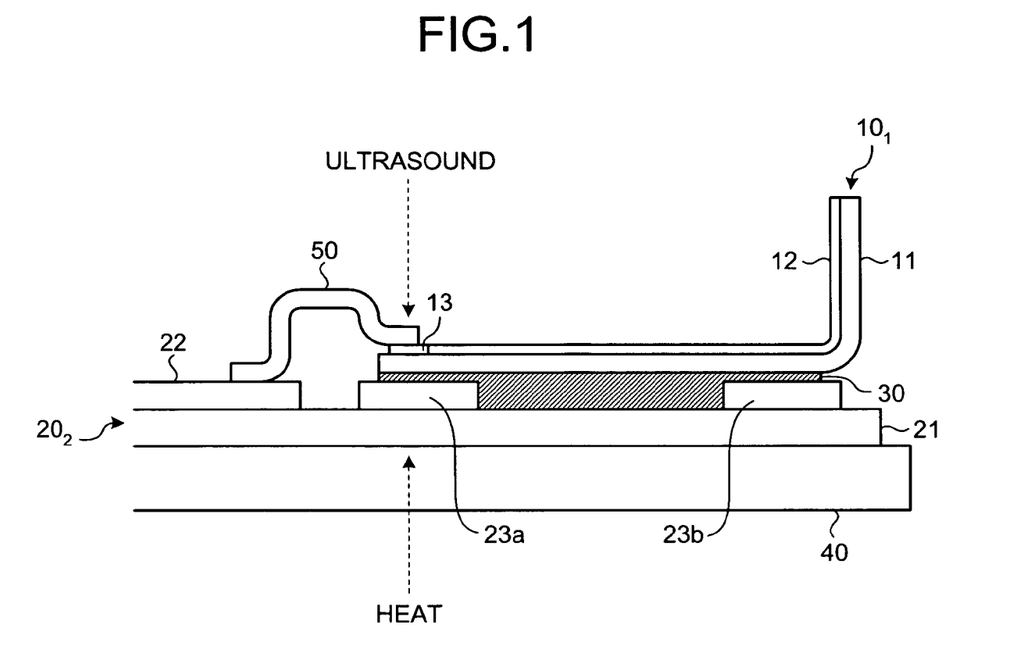
FIG. 1 is a side view for explaining an electrical connection between an electronic printed-circuit board and an FPC board according to an embodiment of the present invention.

Next, the flexible printed-circuit boards bonding method according to an embodiment of the present invention will be explained. FIG. 1 is a side view for explaining an electrical connection between an electronic printed-circuit board $20_2$ and the FPC board $10_1$ by performing the wire-bonding, which are bonded together through the flexible printed-circuit boards bonding method according to an embodiment of the present invention.

Even in FIG. 1, the FPC board $10_1$ and the electronic printed-circuit board $20_1$, are bonded with the adhesive 30 and arranged on the wire bonder stage 40. An electrical connection is established between the FPC board $10_1$ and the electronic printed-circuit board $20_2$ by performing the wire-bonding between the wire 50 and the bonding pad 13 of the FPC board $10_1$.

As shown in FIG. 1, with the flexible printed-circuit boards bonding method according to the embodiment, hard and highly thermally conductive blocks 23a and 23b, which are protruding members, are formed on the electronic printed-circuit board $20_2$, with which a convex surface is provided, so that the layer of the adhesive 30 is prevented from absorbing the ultrasound and lowering the heating efficiency, while a sufficient fixation strength is to be ensured.

The blocks 23a and 23b are spaced apart from each other, and the adhesive 30 is supplied drop-by-drop in the space between the blocks 23a and 23b. The FPC board $10_1$ is bonded to the electronic printed-circuit board $20_2$ in such a manner that the bonding pad 13 is placed exactly above either the block 23a or the block 23b. FIG. 1 depicts an example in which the bonding is performed so that the bonding pad 13 is placed exactly above the block 23a.

In the bonding process, the FPC board $10_1$ is pressed against the electronic printed-circuit board $20_2$, and the excess of the adhesive 30 flows out through the gap between the blocks 23a and 23b. As a result, the adhesive 30 is spread with a small thickness immediately under the bonding pad 13 and with a large thickness between the blocks 23a and 23b.

Because the portion of the layer of the adhesive 30 under the bonding pad 13 is thin, the ultrasonic vibration applied on top of the bonding pad 13 to perform the wire-bonding between the wire 50 and the bonding pad 13 generates sufficient friction without being absorbed by the layer of the adhesive 30. In addition, the heat applied from beneath the bonding pad 13 through the board 21 and the adhesive 30 sufficiently flows to the contact portion, which improves the contact effect.

Further, because the portion of the layer of the adhesive 30 between the blocks 23a and 23b is thick, the sufficient fixation strength is ensured in the bonding between-the FPC board $10_1$ and the electronic printed-circuit board $20_2$. Therefore, according to the flexible printed-circuit boards bonding method of the embodiment, it is possible to prevent the layer of the adhesive 30 from absorbing the ultrasound and lowering the heating efficiency, and ensure the fixation strength at the same time.

Because the FPC board $10_1$ is supported by the blocks 23a and 23b during the bonding process, problems such that the FPC board $10_1$ is to be bonded to the electronic printed-circuit board $20_2$ in a tilted manner and the thicknesses of the adhesive 30 become different among different units can be prevented.

Although the example of the two rectangular blocks 23a and 23b formed on the electronic printed-circuit board $20_2$ is shown in FIG. 1, the number, shape, height, arrangement, and the like of the blocks can be changed as required, in accordance with the dimensions of the FPC board $10_1$ and the required fixation strength. For instance, if the fixation strength needs to be set high, the spacing between the blocks 23a and 23b needs to be widened, and the height of the blocks needs to be increased.

Further, the blocks 23a and 23b can be formed of any material as long as the material is hard and highly thermally conductive. For instance, the blocks 23a and 23b can be formed as part of the wiring pattern similar to the wiring 22. In general, the wiring pattern on the electronic printed-circuit board $20_2$ is formed by etching a thin copper film. Accordingly, by forming the blocks 23a and 23b as part of the wiring pattern, the targeted form can be achieved without adding an extra producing process. As the material, copper is preferable because the copper is hard and highly thermally conductive.

In the example shown in FIG. 1, the electronic printed-circuit board $20_2$ and the FPC board $10_1$ are bonded to each other, and the wiring is individually connected through the wire-bonding. However, the flexible printed-circuit boards bonding method according to the embodiment is equally effective for connecting the wiring of printed circuit boards and electronic parts, or for connecting electronic parts together, by the wire-bonding. In addition, the flexible printed-circuit boards bonding method according to the embodiment is equally effective for bonding the FPC boards and performing the wire-bonding of the wiring or the like provided on wiring boards.

Figure 2:
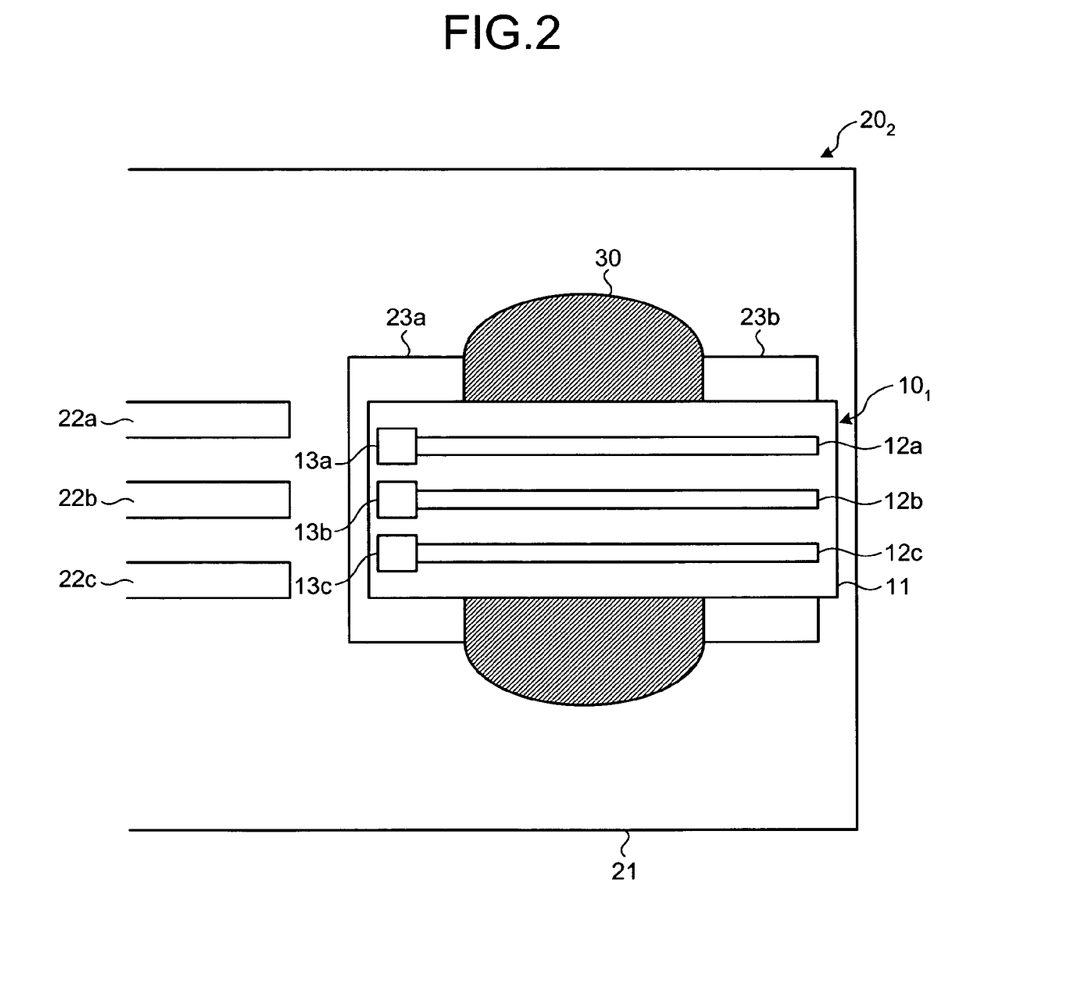
FIG. 2 is a top view of the electronic printed-circuit board and the FPC board shown in FIG. 1.

FIG. 2 is a top view of the electronic printed-circuit board $20_2$ and the FPC board $10_1$ shown in FIG. 1. In FIG. 2, the wiring 12 includes three wires of 12a to 12c, which are substantially parallel to one another. In a similar manner, the bonding pad 13 includes three bonding pads 13a to 13c and the wiring 22 includes three wiring 22a to 22c.

As shown in FIG. 2, an excess amount of the adhesive 30 flows out between the blocks 23a and 23b onto the electronic printed-circuit board $20_2$. When the portion of the layer of the adhesive 30 beneath the bonding pad 13 is made to be thin and the adhesive 30 is to be sufficiently filled in the space between the blocks 23a and 23b, the excess amount of the adhesive 30 flows onto the electronic printed-circuit board $20_2$.

The excess of the adhesive 30 covers electronic parts on the electronic printed-circuit board $20_2$ and causes defects such that the electronic parts cannot be connected to other electronic parts. To avoid such defects, according to another embodiment of the present invention, blocks similar to the blocks 23a and 23b are arranged onto the electronic printed-circuit board $20_2$ to control the flow of the excess of the adhesive 30.

Figure 3:
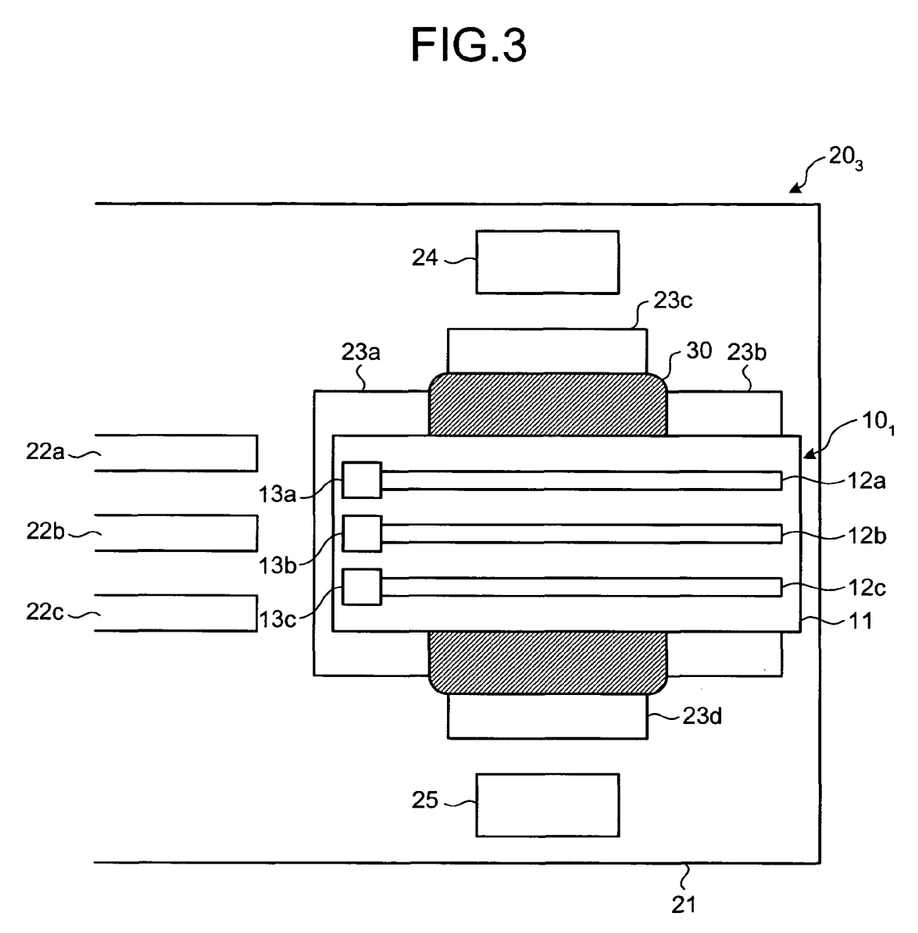
FIG. 3 is a top view of an electronic printed-circuit board and an FPC board according to another embodiment of the present invention.

FIG. 3 is a top view for explaining an example of additional blocks provided to control the flow of the excess of the adhesive 30. In FIG. 3, blocks 23c and 23d are arranged on an electronic printed-circuit board $20_3$ in such a manner as to fill the gap between the blocks 23a and 23b, so that the excess of the adhesive 30 cannot flow toward electronic parts 24 and 25 on the electronic printed-circuit board $20_3$.

Through the arrangement of the blocks, the flow of the excess of the adhesive 30 can be controlled, and defects caused by the flow can be avoided. The arrangement of the blocks 23a to 23d shown in FIG. 3 is one example, and arrangement, the number, shape, height, and the like of the blocks can be determined as required in accordance with the intended way of controlling the flow of the excess.

For example, if it is required to prevent the excess of the adhesive 30 from flowing in a specific direction, the blocks can be arranged with a space between the blocks so that the excess of the adhesive 30 can flow in a different direction. Thus, by discharging the excess of the adhesive 30 without affecting the electronic parts of the electronic printed-circuit board $20_3$ and the like, it is possible to prevent the differences of the layer thickness of the adhesive 30 among the different units caused by the amounts of the dropping of the adhesive 30.

On the other hand, to completely stop the excess from flowing out, the blocks can be arranged in such a manner as to have no spacing between the blocks. When the adhesive 30 has a low viscosity, it is effective to narrow down the spacing between the blocks for blockading the excess. When the adhesive 30 has a high viscosity, the excess does not flow out as much, even if the spacing between the blocks is set wider.

The flow of the excess of the adhesive 30 can as well be controlled by other methods. As still another embodiment of the present invention, FIG. 4 is a top view for explaining an example of controlling the flow of the excess of the adhesive 30 by forming holes in an FPC board $10_2$.

Figure 4:
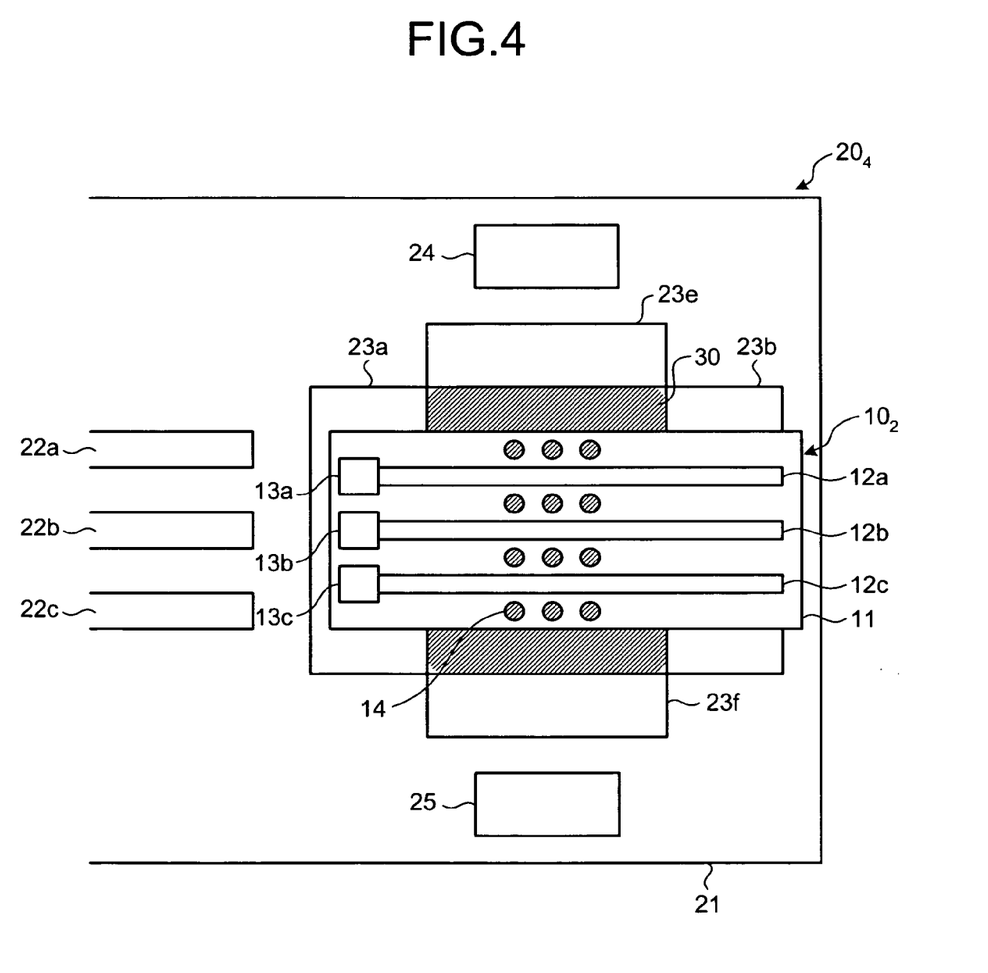
FIG. 4 is a top view of an electronic printed-circuit board and an FPC board according to still another embodiment of the present invention.

In FIG. 4, several holes 14 are formed in the film 11 of the FPC board $10_2$, and the blocks 23a, 23b, 23e, and 23f are placed on an electronic printed-circuit board $20_4$ in such a manner to have no spacing between the blocks. Accordingly, the excess of the adhesive 30 flows out through the holes 14 onto the FPC board $10_2$ and does not flow to reach the electronic parts 24 and 25, in the process of bonding the FPC board $10_2$ and the electronic printed-circuit board $20_4$.

As described above, by forming holes in the FPC board $10_2$, the flow of the excess of the adhesive 30 can be controlled and an occurrence of the defects caused by the flow can be prevented. Further, by discharging the excess of the adhesive 30 toward the top of the FPC board $10_2$, the layer of the adhesive 30 attains a uniform thickness among units regardless of the supply amount of the adhesive 30. The process performed on the FPC board $10_2$ shown in FIG. 4 is one example and the number, shape, arrangement, size, and the like of the holes 14 can be determined in accordance with the required fixation strength, the viscosity of the adhesive 30, and the like.

Figure 5:
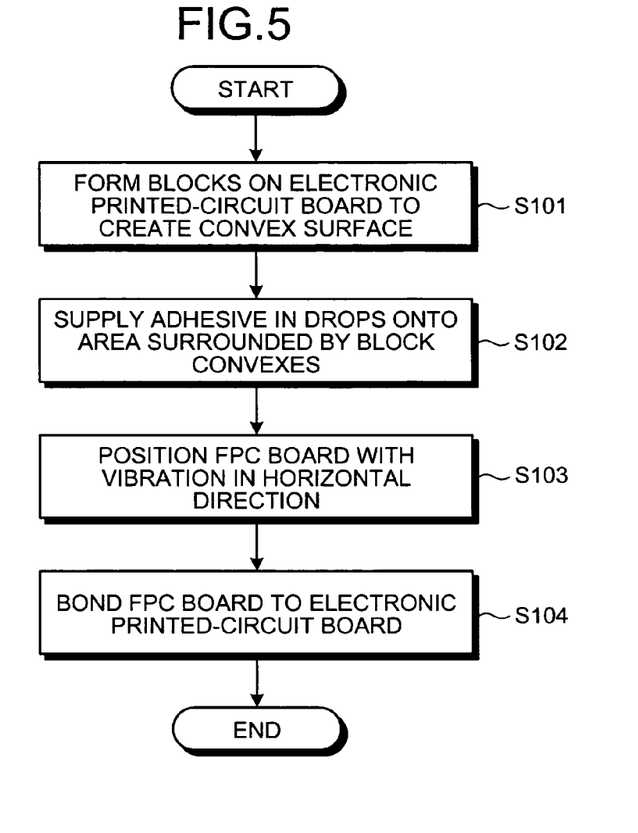
FIG. 5 is a flowchart of a flexible printed-circuit boards bonding method according to still another embodiment of the present invention.

Next, the processing procedure of the flexible printed-circuit boards bonding method according to still another embodiment the present invention is explained through an example of bonding the FPC board $10_1$ and the electronic printed-circuit board $20_2$ shown in FIG. 1. FIG. 5 is a flow-chart of the processing procedure for an operation of the flexible printed-circuit boards bonding method according to the embodiment.

Figure 6:
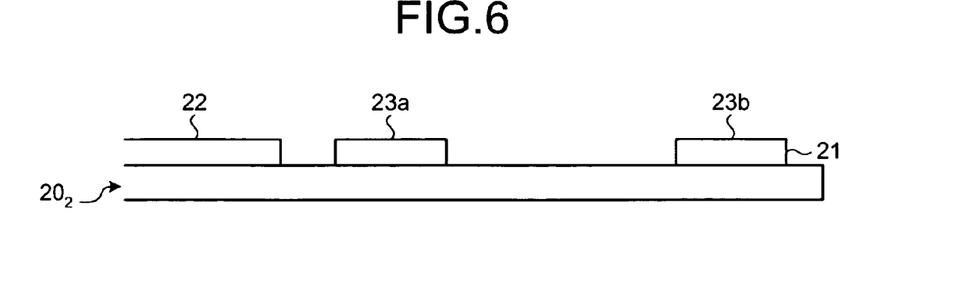
FIG. 6 is a side view for explaining a first step of the flexible printed-circuit boards bonding method.
Figure 7:
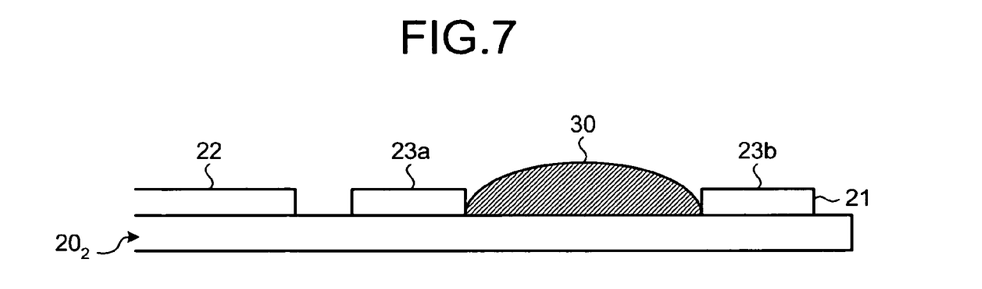
FIG. 7 is a side view for explaining a second step of the flexible printed-circuit boards bonding method.

The blocks 23a and 23b are formed on the board 21 of the electronic printed-circuit board $20_2$ as shown in FIG. 6 (Step S101). The blocks 23a and 23b can be formed at the same timing of forming the wiring 22, or at a different timing from forming the wiring 22. A predetermined amount of the adhesive 30 is supplied in drops onto an area between the blocks 23a and 23b as shown in FIG. 7 (Step S102).

Figure 8:
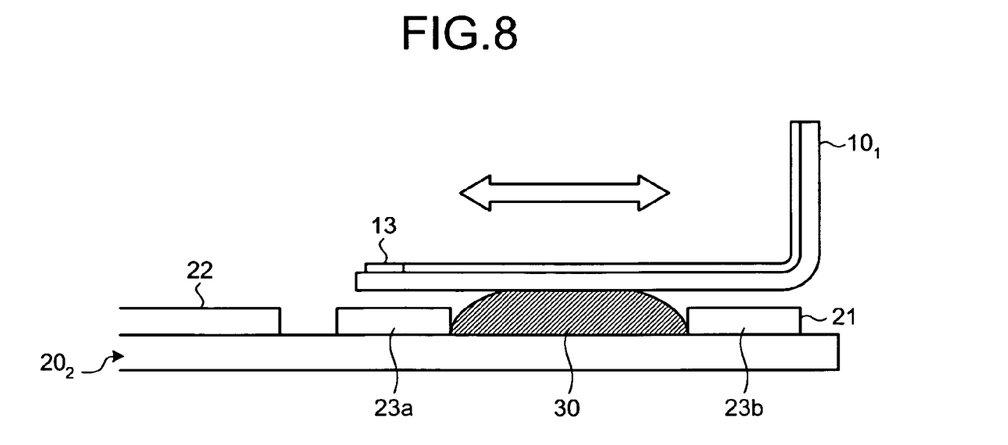
FIG. 8 is a side view for explaining a third step of the flexible printed-circuit boards bonding method.

The FPC board $10_1$ is pressed against the board 21 with vibration of the FPC board $10_1$ in a microscale in a horizontal direction with respect to the bonding surface, and the position of the FPC board $10_1$ is determined so that the bonding pad 13 on the FPC board 101 is placed above the block 23a as shown in FIG. 8 (Step S103). The FPC board $10_1$ has to be vibrated in a microscale so that the adhesive 30 properly spreads through the space surrounded by the FPC board $10_1$, the board 21, and the blocks 23a and 23b, from corner to corner.

Figure 9:
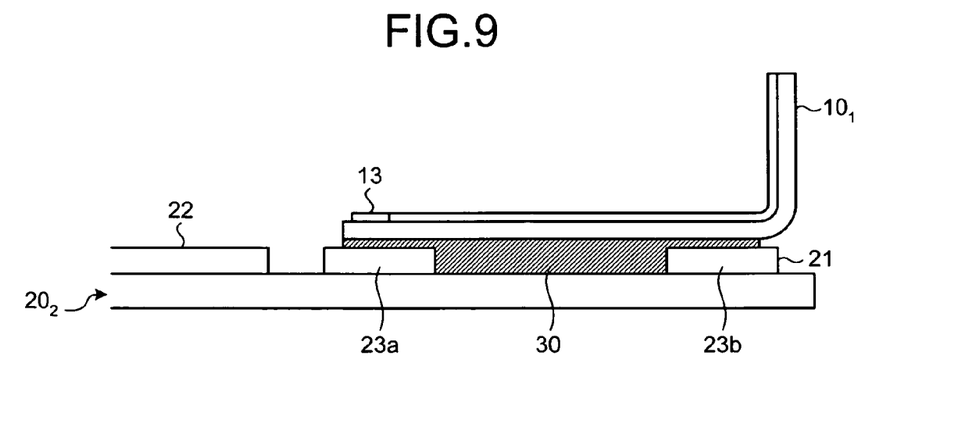
FIG. 9 is a side view for explaining a completed state obtained by the flexible printed-circuit boards bonding method.

After the positioning is determined and the excess of the adhesive 30 is discharged by sufficiently pressing the FPC board $10_1$ against the electronic printed-circuit board $20_2$, the adhesive 30 is stabilized. In this manner, the bonding of the FPC board 101 and the electronic printed-circuit board $20_2$ is completed as shown in FIG. 9 (Step S104).

As described above, according to the embodiments, it is configured in such a manner that, by arranging the blocks on the electronic printed-circuit board, the layer of the adhesive has a thin portion at the position where the wire-bonding is performed on the flexible printed-circuit board, while the remaining portion of the layer is made sufficiently thick. Thus, degradation of the bonding effect of the adhesive can be prevented and the wire-bonding effect can be enhanced, while the sufficient fixation strength can be ensured at the same time.

According to one aspect of the present invention, a portion of an adhesive layer where a wire-bonding process is to be performed onto a flexible printed-circuit board is made thinner than the remaining portion of the adhesive layer. Accordingly, it is possible to prevent the adhesive from reducing the connection effect, to maintain sufficient fixation strength, and to improve the connection effect obtained by the wire-bonding.

Furthermore, according to another aspect of the present invention, the blocks that support the flexible printed-circuit board at the time of bonding prevent the flexible printed-circuit board from being bonded in a tilted manner to the second wiring board and prevent the thickness of the adhesive layer from varying from one unit to another.

Moreover, according to still another aspect of the present invention, the blocks are formed as a portion of the wiring pattern so that the block formation can be realized without adding an extra processing step.

Furthermore, according to still another aspect of the present invention, the blocks are formed in such a shape as to stop an excess amount of the adhesive from flowing out. Therefore, the flown-out excessive adhesive does not affect the wiring or parts of the wiring boards.

Moreover, according to still another aspect of the present invention, the blocks are formed into such a shape as to control the flowing direction of the excess amount of the adhesive to be discharged. Accordingly, it is possible to prevent the formation of the adhesive layer from varying in accordance with the amount of the dropping of the adhesive, and to prevent the flown-out excess of the adhesive from affecting the wiring and parts on the wiring boards.

Furthermore, according to still another aspect of the present invention, the spacing between the blocks is adjustable in accordance with the fixation strength that is required. Thus, a reliable printed circuit board with the sufficient fixation strength can be achieved.

Moreover, according to still another aspect of the present invention, the height of the blocks is adjustable in accordance with the fixation strength that is required. Thus, a reliable printed circuit board with the sufficient fixation strength can be achieved.

Furthermore, according to still another aspect of the present invention, the spacing of the blocks is set small when the adhesive has a low viscosity. Accordingly, the excess of the adhesive can be prevented from flowing out, resulting in not causing an effect on the wiring and the parts on the wiring boards.

Moreover, according to still another aspect of the present invention, the flexible printed-circuit board is bonded to the second wiring board, with vibration of the circuit board. In this manner, the adhesive can spread corner to corner of the area-surrounded by the wiring board and the blocks.

Furthermore, according to still another aspect of the present invention, holes are formed in the flexible printed-circuit board to discharge the excess amount of the adhesive. Therefore, while the flown-out excess of the adhesive is prevented from affecting the wiring and the parts on the wiring board, the uniformity in the adhesive layer can be attained, regardless of the amount of the dropping of the adhesive.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A flexible printed-circuit boards bonding method for bonding a first wiring board that is formed of a flexible printed-circuit board and a second wiring board that is to be electrically connected to a bonding pad of the first wiring board by wire-bonding, the flexible printed-circuit boards bonding method comprising:
   forming a plurality of protruding members on a surface of the second wiring board;
   depositing an adhesive on a space of the surface of the second wiring board between at least two of the plurality of protruding members; and
   placing, after the depositing, the first wiring board on the second wiring board so that a portion of the first wiring board to be used for the wire-bonding is positioned above at least one of the protruding members and bonding a side of the first wiring board to the second wiring board with the adhesive, the side being opposite to a side on which the bonding pad is mounted.

2. The flexible printed-circuit boards bonding method according to claim 1, wherein the forming includes forming the protruding members as part of a wiring pattern formed on the second wiring board.

3. The flexible printed-circuit boards bonding method according to claim 1, wherein the forming includes forming the protruding members such that the adhesive does not flow out when the first wiring board is placed on the second wiring board at the placing.

4. The flexible printed-circuit boards bonding method according to claim 1, wherein the forming includes forming the protruding members such that the adhesive does not flow out in a specific direction when the first wiring board is placed on the second wiring board at the placing.

5. The flexible printed-circuit boards bonding method according to claim 1, wherein the forming includes controlling positions of the protruding members based on required fixation strength between the first wiring board and the second wiring board.

6. The flexible printed-circuit boards bonding method according to claim 1, wherein the forming includes controlling heights of the protruding members from the surface of the second wiring board based on required fixation strength between the first wiring board and the second wiring board.

7. The flexible printed-circuit boards bonding method according to claim 1, wherein the forming includes controlling positions of the protruding members based on a viscosity of the adhesive.

8. The flexible printed-circuit boards bonding method according to claim 1, wherein the placing includes pressing the first wiring board against the second wiring board while vibrating the first wiring board in a horizontal direction with respect to the second wiring board thereby making thickness of the adhesive between the first and the second wiring boards uniform before the adhesive gets hard.

9. The flexible printed-circuit boards bonding method according to claim 1, further comprising forming at least one hole in the first wiring board at a portion that comes in contact with the adhesive.

10. The flexible printed-circuit boards bonding method according to claim 1, further comprising performing a wire-bonding on the first wiring board, with heat being applied onto the first wiring board through any one of the protruding members.

11. The flexible printed-circuit boards bonding method according to claim 1, wherein the second wiring board is a flexible printed-circuit board.

12. The flexible printed-circuit boards bonding method according to claim 1, wherein the placing includes forming a layer of the adhesive that is thinner on the protruding members than between protruding members such that the first wiring board is bonded to the second wiring board with the layer of the adhesive on the protruding members and between the protruding members.

* * * * *